United States Patent
Betancourt

(10) Patent No.: US 10,524,368 B1
(45) Date of Patent: Dec. 31, 2019

(54) TAMPER PROOF MOBILE TRACKING SYSTEM

(71) Applicant: Rolando Betancourt, Miami, FL (US)

(72) Inventor: Rolando Betancourt, Miami, FL (US)

( * ) Notice: Subject to any disclaimer, the term of this patent is extended or adjusted under 35 U.S.C. 154(b) by 0 days.

(21) Appl. No.: 16/416,922

(22) Filed: May 20, 2019

(51) Int. Cl.
*G08B 23/00* (2006.01)
*H05K 5/02* (2006.01)
*G07C 9/00* (2006.01)
*G06K 19/077* (2006.01)
*G08B 21/22* (2006.01)

(52) U.S. Cl.
CPC ..... *H05K 5/0208* (2013.01); *G06K 19/07713* (2013.01); *G06K 19/07762* (2013.01); *G07C 9/00111* (2013.01); *G08B 21/22* (2013.01)

(58) Field of Classification Search
CPC ............ G08B 21/0211; G08B 21/0225; H05K 5/0208
USPC .................... 340/573.4, 539.1–539.13, 693.5
See application file for complete search history.

(56) References Cited

U.S. PATENT DOCUMENTS

| | | | | |
|---|---|---|---|---|
| 5,742,233 A | * | 4/1998 | Hoffman | G08B 21/023 340/10.41 |
| 6,072,396 A | * | 6/2000 | Gaukel | G16H 40/67 340/573.4 |
| 2012/0050532 A1 | * | 3/2012 | Rhyins | G01S 5/14 348/143 |
| 2012/0157037 A1 | * | 6/2012 | Hoffman | G08B 25/08 455/404.2 |
| 2014/0019913 A1 | * | 1/2014 | Newman | G06F 3/0488 715/810 |

* cited by examiner

*Primary Examiner* — Tai T Nguyen
(74) *Attorney, Agent, or Firm* — Ruben Alcoba, Esq.

(57) ABSTRACT

A tamper proof mobile tracking system that has a base unit that comprises of a base band transceiver, a GPS chip, a power supply, and a microprocessor that has an RFID interrogator. A locking unit, the locking unit comprises of a locking pin that powers an active RFID tag within the locking unit and that operatively connects to the base unit. A band, the band comprises of a active RFID tag and an embedded antenna that powers the active RFID tag when the base unit, the locking unit and the band are all operatively connected. And, a central unit that communicates with the base unit that tracks and detect faults associated with the base unit, the locking unit and the band when they are all operatively connected. The system is used by governmental entities to monitoring for the tampering of devices that are used by the system.

8 Claims, 4 Drawing Sheets

TAMPER PROOF MOBILE TRACKING SYSTEM

BACKGROUND

The present invention pertains generally to the field of tracking devices that are placed on inmates that are probationally released from jail.

Presently, there are tracking devices in the market that will alarm a central unit when a device is removed from a wearer. The central unit is defined to be a monitoring center that wirelessly communicates with the devices. The present invention is an improvement to the devices in the market.

The present device comprises of a front transmitting plate (the transmitting plate shall also be referred as the base unit) that secures to a disposable back plate. The base unit and back plate secure a strap or a band between the base unit and back plate after the band is wrapped around the ankle of an inmate. The back plate normally has an attachment pin that inserts within the base unit through a pin slot. The pin depresses a mechanical switch on the base unit. If the back plate is removed from the base unit, the mechanical switch on the base unit will no longer be depressed. The activation of the mechanical switch will send an electrical signal to a microprocessor on the base unit. The microprocessor will interpret this signal as a fault defined by the removal of the back plate from the base unit indicating an unauthorized tampering or removal of the device by the inmate. Some of the devices use a band that will also alarm the central unit if the band has been tampered with.

Some of the present devices back plate use a pin that is designed to break when the back plate is removed from the base unit. The pin is what depresses the mechanical switch on the base unit. With the advent of 3D Printers, back plates can be easily reproduced. This could allow inmates to devise ways of removing back plates without detection. For example, inmates manually depress the mechanical switch of the base unit using a pin or a similar object while removing the back plate. By depressing the mechanical switch, the fault is prevented from being detected. The inmate can then insert a permanent object or a 3D printed counterfeit back plate into the pin slot of the base unit depressing the mechanical switch, thereby avoiding detection of the tampering of the device.

When tamper detection by means of the mechanical switch is circumvented, the inmate is able to remove the device without detection. The issuing authority of the tracking device will be prevented from tracking the inmate and the inmate will be free to escape from a geographic location or will be free to move within geographic locations that are contrary to the release of the inmate. The inmate can then reattach the device using an illegally obtained or a 3D printed counterfeit back plate, thereby avoiding any detection.

Another problem that arises with present tracking devices is that sometimes they power-down. When the devices power-down, an inmate can easily remove the backplate and attach a 3D printed counterfeit back plate to the base unit. In the event of a power-down, the bad actor can just break off the backplate and attach an illegally obtained, or 3D printed counterfeit backplate.

Some devices use a strap or band with an embedded fiber optic cable. The fiber optic cable is intended to detect removal of the device by means of cutting the strap or band. The advent of 3D printers make the fiber optic security straps less effective, for the straps do not have to be cut to remove the tracking device from the inmate. Simply depressing the pin and changing the back plate is all that is needed to overcome the fiber optic security strap equipped devices.

The present invention is a tamper proof mobile tracking system that will provide governmental entities with a tracking system that will detect the tampering with the tacking devices placed on individuals being monitored by the system.

SUMMARY

The present invention is a tamper proof mobile tracking system that is placed on individuals being monitored by governmental entities.

The tamper proof mobile tracking system comprises of a base unit that comprises of a base band transceiver, a global positioning system (hereinafter referred as a GPS) chip, a power supply, and a microprocessor that has an radio frequency identification device (hereinafter referred as an RFID) interrogator. A locking unit, the locking unit comprises of a locking pin that powers an active RFID tag within the locking unit and that operatively connects to the base unit. A band, the band comprises of and active RFID tag and an embedded antenna that powers the active RFID tag when the base unit, the locking unit and the band are all operatively connected. And a central unit that communicates with the base unit that tracks and detect faults associated with the base unit, the locking unit and the band when they are all operatively connected. The system's locking pin is a single use locking pin. The base band transceivers function is to provide wireless communication between the base unit and the central unit. The function of the GPS chip is to provide real time positioning of the device. The power supply supplies power to the base unit, the locking unit and the band. The function of the RFID interrogator is to communicate with the embedded RFID tags located in the locking unit and band. The function of the microprocessor is to monitor the state of the mechanical switch to establish and maintain communication between the base unit and the central unit by means of the baseband transceiver, to interface with the RFID interrogator to receive RFID tag information from the locking unit and the band, and to validate the RFID devices tag information using a pre-selected key encryption algorithm. The locking plate is the physical back plate of the present invention. The locking pins of the locking unit provide mechanical and electrical connections between the base unit and the locking unit and the locking unit has an embedded active RFID device tag. The function of the central unit is to configure the base unit by means of wireless communication, to maintain wireless communication with the base unit and alert governmental entities when a fault is received from the base unit.

An object of the present invention is to provide a tamper proof mobile tracking system that will allow governmental entities to monitor the tampering of devices used by the system.

Another object of the present invention is to provide a tamper proof mobile tracking system that will deter inmates from attempting to tamper with devices used by the system.

Yet another object of the present invention is to provide a tamper proof mobile tracking system that will provide monitoring devices that cannot be reproduced by 3D printers.

Still another object of the present invention is to provide a tamper proof mobile tracking system that will allow governmental entities to detect the tampering of devices used by the system.

DRAWINGS

These and other features, aspects, and advantages of the present invention will become better understood with regards to the following description, appended claims, and drawings where:

DESCRIPTION

Figure 1:
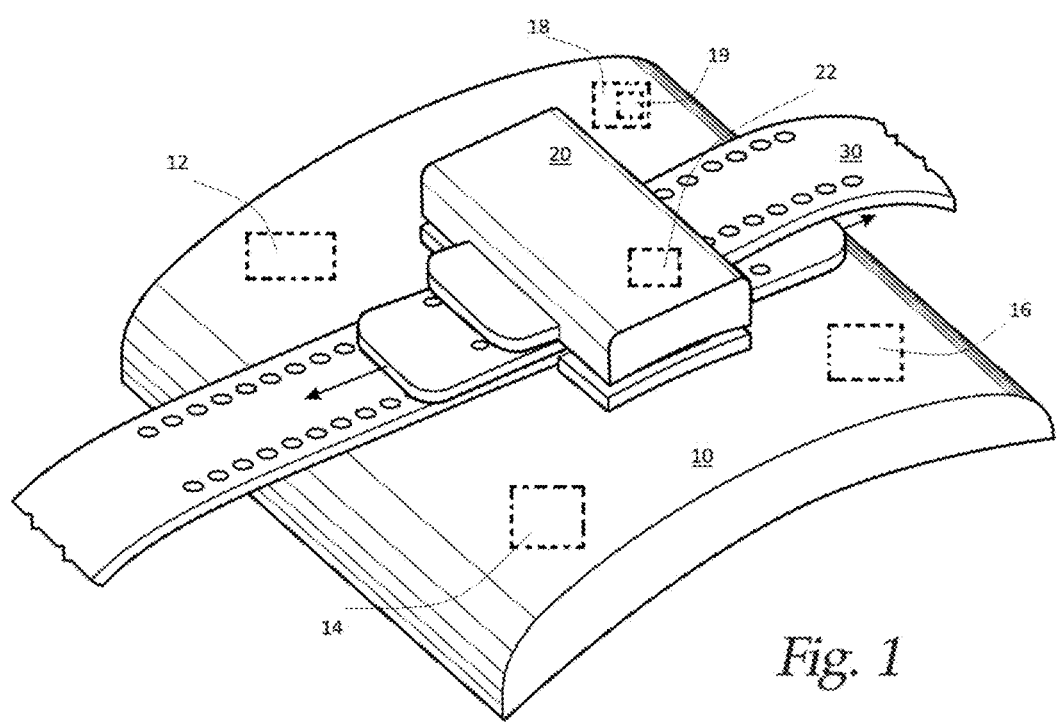
FIG. 1 is a perspective view that shows the base unit, the locking unit and the band of the present invention.
Figure 2:
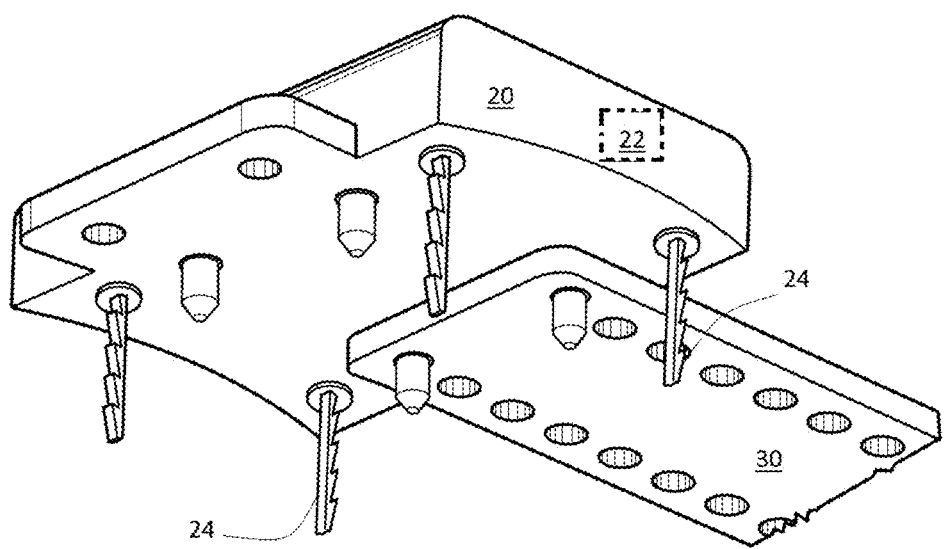
FIG. 2 is a perspective view that shows how the base unit and the band are interlocked, the figure also shows the one time use pins of one of the embodiments of the present invention.
Figure 3:
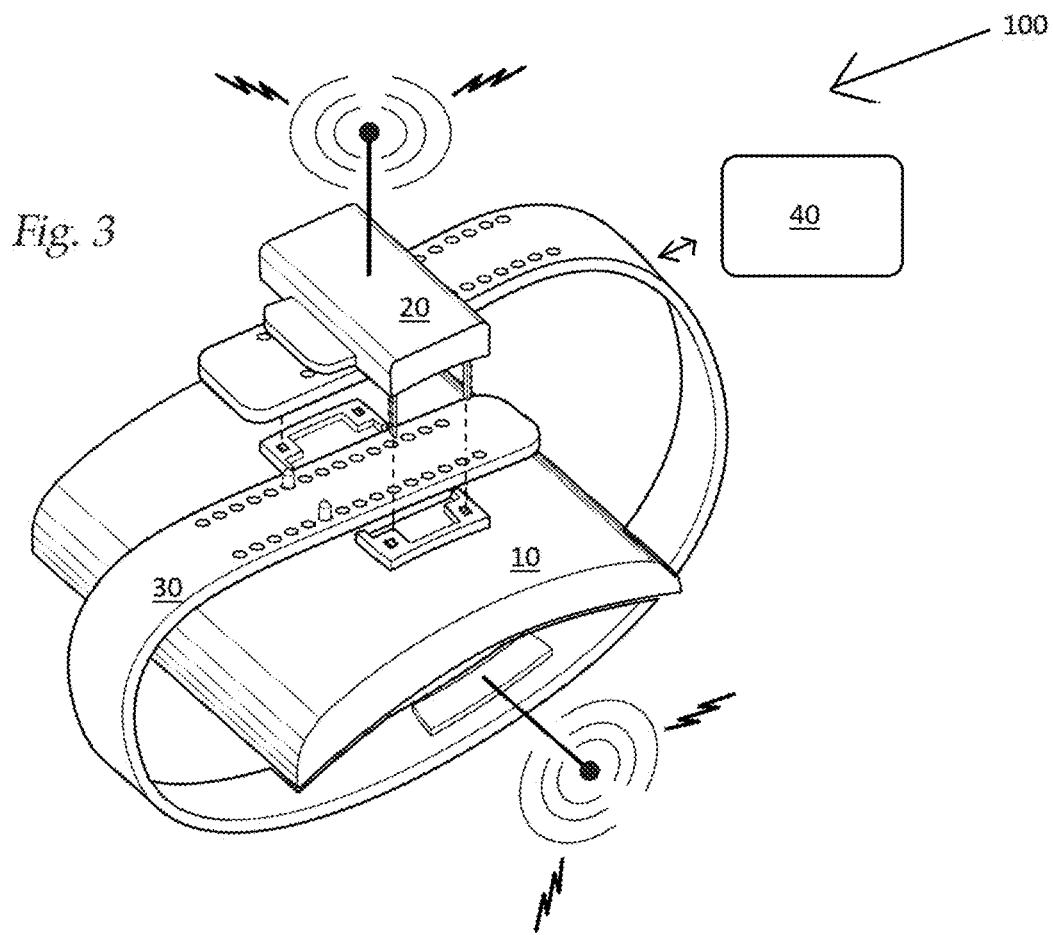
FIG. 3 is a perspective view of the devices used by the present invention.
Figure 4:
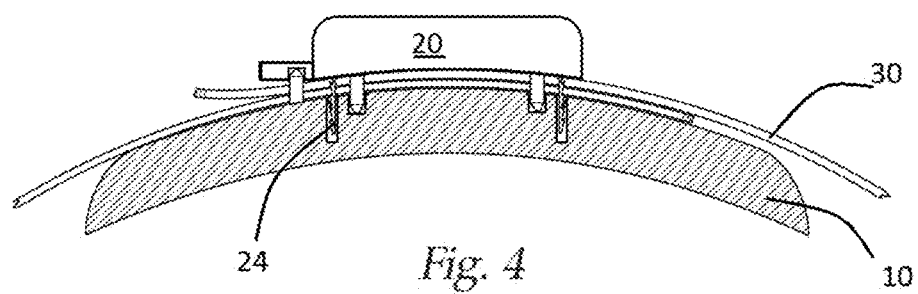
FIG. 4 is a side view of the present invention that shows the base unit, the band, and the locking unit interlocked.
Figure 5:
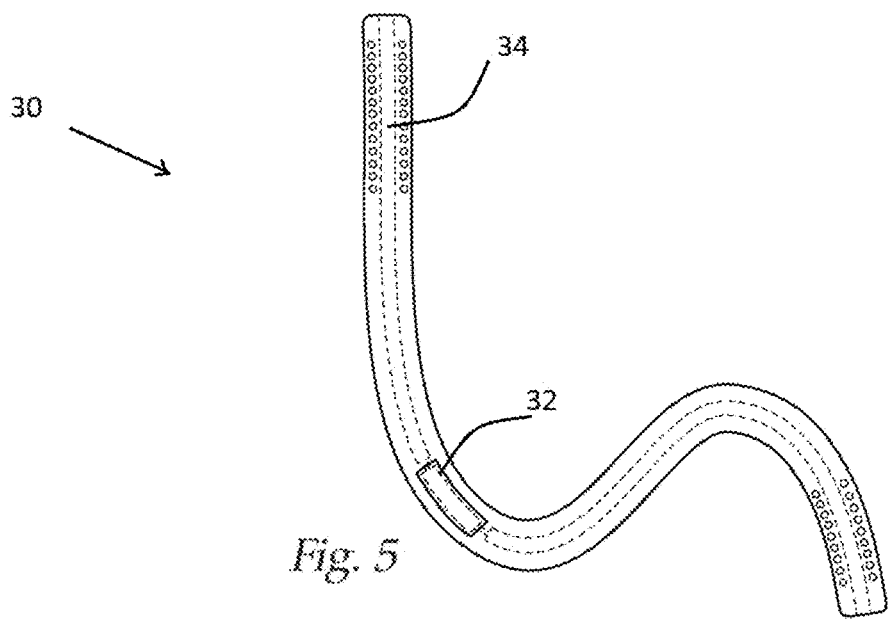
FIG. 5 is a top plan view of the band that is used on one of the embodiments of the present invention.
Figure 6:
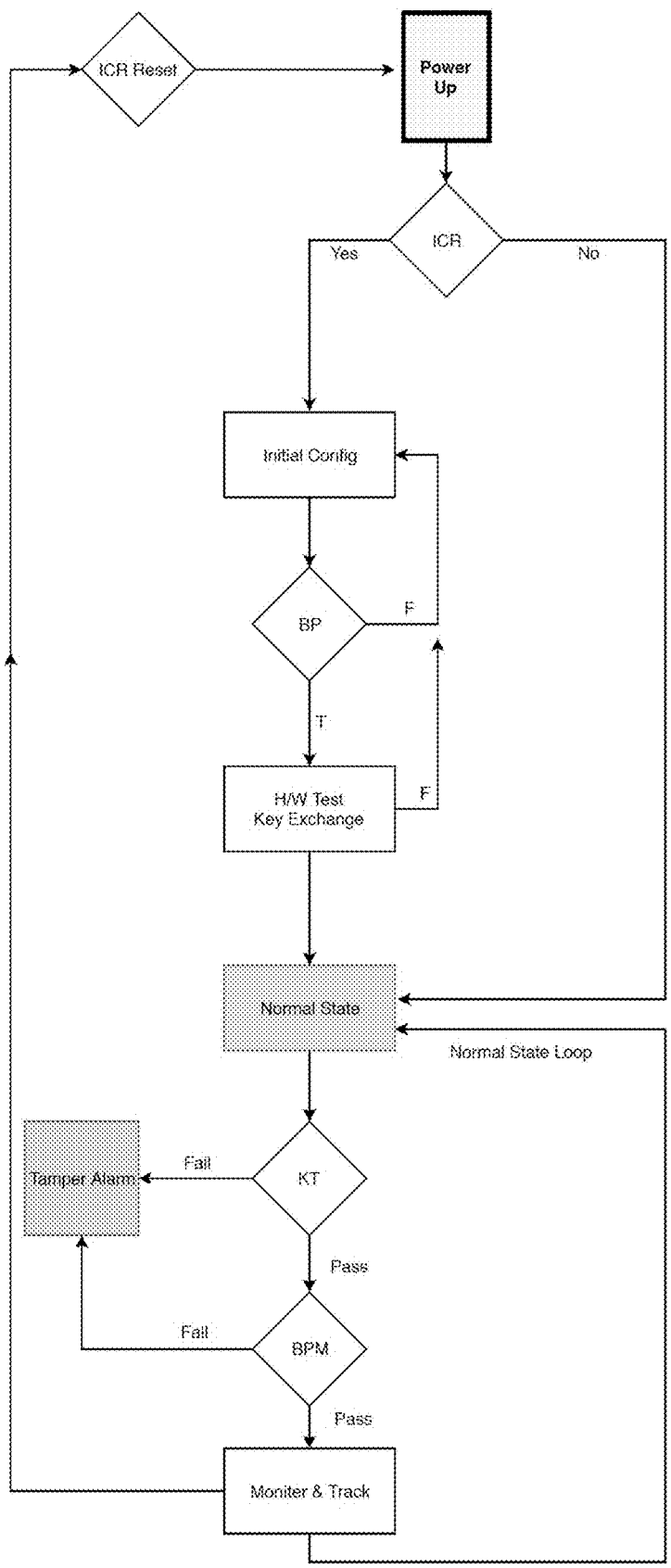
FIG. 6 is a flow chart that shows one embodiment of how the system of the present invention is programmed.

Referring to FIGS. 1-6, the present invention is a tamper proof mobile tracking system 100, the system comprises of a base unit 10 that comprises of a base band transceiver 12, a GPS chip 14, a power supply 16, and a microprocessor 18 that has an RFID interrogator 19. A locking unit 20, the locking unit 20 comprises of a locking pin 24 that powers an active RFID tag 22 within the locking unit 20 and that operatively connects to the base unit 10. A band 30, the band comprises of a active RFID tag 32 and an embedded antenna 34 that powers the active RFID tag 32, through inductive power transfer, when the base unit 10, the locking unit 20 and the band 30 are all operatively connected and alerts governmental entities of system status. And, a central unit 40 that communicates with the base unit 10 that tracks and detects faults received from the base unit 10, the locking unit 20 and the band 30 when they are all operatively connected. The locking pin 24 provides the mechanical and electrical connection between the base unit 10 and the locking unit 20.

The power supply 16 of the base unit 10 serves as a main power source for the base unit 10, the locking unit 20 and the band 30, wherein the base band transceiver 12 sends and receives an encrypted information from the central unit 40 as to the status of the faults and connections and the programming between the base unit 10, the locking unit 20 and the band 30, wherein GPS chip 14 serves to inform the central unit 40 of the location of the base unit 10, and wherein the RFID interrogator 19 first receives a command from the central unit 40 upon the base unit 10, the locking unit 20 and the band 30 all being operatively connected to program the active RFID tag 22 of the locking device 20 and the active RFID tag 32 of the band 30 with a unique code sequence that generates a secret key seed value and to monitor the connection between the locking unit 20 and the band 30 and also to monitor the secret key values of the active RFID tag 22 of the locking device 20 and of the active RFID tag 32 of the band 30 for physical and electronic tampering.

The unique code sequence allows the RFID interrogator 19 to detect any secret key error which would indicate tampering of the base unit 10, the locking unit 20 and/or the band 30 if power is interrupted between the base unit 10, the locking unit 20 and the band 30.

The active RFID tag 22 of the locking unit 20 is programmed by the RFID interrogator to follow a code to generate, to encrypt and to store a secret key.

The active RFID tag 32 of the band 30 is programmed by the RFID interrogator 19 to follow a code to generate, encrypt and store a secret key.

The central unit 40 is any network programmed to monitor or track persons being supervised by any entity via any communication protocol.

The locking pin 24 of the locking unit 20 is a single use locking pin 24.

As seen in the Flow chart of the Drawings, the Central Unit works with the devices of the present invention as follows:

Power Up—Device initiates self start on power detection

ICR—Initial Configuration Register—This stores a value in non-volatile memory of 0 or I (zero or one)

ICR=O Device is in initial configuration state

ICR=I Device is in Normal state

ICR can only be reset to ICR=O by an encrypted baseband command from the network Initial Config—Device enters initial configuration state Initial configuration:

1. Both the base unit, locking unit and band will generate a new key based on the seed value key that was received from the central unit 2. The new key will be based on the value of the initial key received from the central unit and the key generating algorithm 3. The new key will be stored on the RFID tags 4. Once the base unit, locking unit and band are properly assembled, the base unit will query the locking unit and band RFID tags 5. The base unit will verify the new keys BP—Device checks for presence of a valid locking unit H/W Test—Device performs self tests of components—

RFID tags—establishes network link

Key Exchange—Device receives encryption key from network

Device programs RFID with Key

Reads back to confirm Key/Pairs

Normal State—Device is registered and active

Normal State loop will run continuously unless Power loss or ICR reset command from network.

KT—Key Test—tests the validity of the RFID tag key/pairs. This crucial test will fail on RFID tampering/spoofing or locking unit removal after power down since the key pairs will not match after restart or removal Key test details:

In case of power down:

1. Both the base unit, locking unit and band will generate a new key based on the key that was stored prior to the power interruption 2. The new key will be based on the value of the old key and the key generating algorithm 3. The new key will be stored on the RFID tags 4. Once the base unit, locking unit and band are properly assembled, the base unit will query the locking unit and band RFID tags 5. The base unit will verify the new keys BPM—Back Plate Monitor—physical electrical connection to back plate must be maintained. This test will fail on any physical back—plate tampering/removal even after power down restart due to above key pair mismatch.

Monitor and Track—Device performs pre-programmed commands and transmits results to network.

ICR Reset—Initial Configuration Reset Command—Encrypted baseband message received from "................" network that resets ICR to configuration state ICR=O This is used for authorized removal and reprogramming of device.

An advantage of the present invention is that it provides a tamper proof mobile tracking system that allows governmental entities to monitor the tampering of devices used by the system.

Another advantage of the present invention is that it provides a tamper proof mobile tracking system that deters inmates from attempting to tamper with devices used by the system.

Yet another advantage of the present invention is that it provides a tamper proof mobile tracking system that provides monitoring devices that cannot be reproduced by 3-d printers.

Still another advantage of the present invention is that it provides a tamper proof mobile tracking system that allows governmental entities to detect the tampering of devices used by the system.

The embodiments of the apparatus and method of use described herein are exemplary and numerous modifications, combinations, variations, and rearrangements can be readily envisioned to achieve an equivalent result, all of which are intended to be embraced within the scope of the appended claims. Further, nothing in the above-provided discussions of the apparatus and method should be construed as limiting the invention to a particular embodiment or combination of embodiments. The scope of the invention is defined by the appended claims.

What is claimed is:

1. A tamper proof mobile tracking system, the system comprises:
    a base unit that comprises of a base band transceiver, a Global Positioning System chip, a power supply, and a microprocessor that has a Radio Frequency Identification Device interrogator, the base unit is placed around the ankle of a wearer;
    a locking unit, the locking unit comprises of a locking pin that is operatively connected to and that delivers an electrical current to an active Radio Frequency Identification Device tag that is within the locking unit, that is operatively connected to the base unit, after the base unit is placed on the wearer;
    a band, the band comprises of an active Radio Frequency Identification Device tag and an embedded antenna that is operatively connected and that delivers an electrical current to the active Radio Frequency Identification Device tag of the band when the base unit, the locking unit and the band are all operatively connected, the band attaches to the locking unit after the base unit and the locking unit are placed on the wearer; and
    a central unit that communicates with the base unit that tracks and detects a fault associated with the base unit, the locking unit and the band when they are all operatively connected, and a fault is defined to be the removal of the locking unit from the base unit or any interruption of a powered circuit that is created when the base unit, the locking unit and the band are all operatively connected.

2. The tamper proof mobile tracking system of claim 1, wherein the power supply of the base unit serves as a main power source for the base unit, the locking unit and the band, wherein the base band transceiver sends and receives an encrypted information from the central unit as to a status of the faults and connections and a programming between the base unit, the locking unit and the band, wherein the Global Positioning System chip serves to inform the central unit of a location of the base unit, and wherein the Radio Frequency Identification Device interrogator first receives a command from the central unit upon the base unit, the locking unit and the band all being operatively connected to program the active Radio Frequency Identification Device tag of the locking device and the active Radio Frequency Identification Device tag of the band with a unique code sequence that has a secret key and to monitor the connection between the locking unit and the band and also to monitor the secret key of the active Radio Frequency Identification Device tag of the locking device and of the active Radio Frequency Identification Device tag of the band for tampering.

3. The tamper proof mobile tracking system of claim 2, wherein the unique code sequence will allow the Radio Frequency Identification Device interrogator to detect any tampering of the base unit, the locking unit and the band if power is interrupted between the base unit, the locking unit and the band.

4. The tamper proof mobile tracking system of claim 3, wherein the active Radio Frequency Identification Device tag of the locking unit is programmed to follow a code and to store and encrypt a secret key.

5. The tamper proof mobile tracking system of claim 4, wherein the active Radio Frequency Identification Device tag of the band is programmed to follow a code and to store and encrypt a secret key.

6. The tamper proof mobile tracking system of claim 5, wherein the central unit is any network programmed to monitor or track persons being supervised by any entity via any communication protocol.

7. The tamper proof mobile tracking system of claim 6, wherein the locking pin is a single use locking pin.

8. The tamper proof mobile tracking system of claim 1, wherein the locking pin is a single use locking pin.

* * * * *